(12) United States Patent
Yagi

(10) Patent No.: US 6,677,178 B2
(45) Date of Patent: Jan. 13, 2004

(54) SEMICONDUCTOR DEVICES INCLUDING BACK-SURFACE-INCIDENCE CCD LIGHT-SENSORS, AND METHODS FOR MANUFACTURING SAME

(75) Inventor: Takeshi Yagi, Koganei (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/805,669

(22) Filed: Mar. 13, 2001

(65) Prior Publication Data

US 2001/0026001 A1 Oct. 4, 2001

(30) Foreign Application Priority Data

Mar. 14, 2000 (JP) ........................................ 2000-070594

(51) Int. Cl.⁷ .............................................. H01L 21/00
(52) U.S. Cl. ........................................................ 438/75
(58) Field of Search ...................................... 438/75, 26

(56) References Cited

U.S. PATENT DOCUMENTS

| 5,623,147 A | 4/1997 | Baert et al. |
| 5,731,116 A | * 3/1998 | Matsuo et al. ................ 430/56 |
| 5,844,238 A | 12/1998 | Sauer et al. |
| 5,851,847 A | * 12/1998 | Yamanka ..................... 438/26 |
| 5,965,886 A | 10/1999 | Sauer et al. |

FOREIGN PATENT DOCUMENTS

| EP | 0 570 224 A2 | 5/1993 |
| JP | 5-41510 | 2/1993 |

* cited by examiner

*Primary Examiner*—David Nelms
*Assistant Examiner*—Thao P Le
(74) *Attorney, Agent, or Firm*—Klarquist Sparkman, LLP

(57) ABSTRACT

Methods are disclosed for fabricating any of various semiconductor devices that include a reinforcing substrate bonded to a device substrate, wherein stresses between the two substrates are reduced compared to conventional devices. In the context of a back-surface-incidence (BSI) CCD light sensor, one or more pixels of a light-sensing array are formed on the surface of a "CCD" or "device" substrate. A layer of a curable resin adhesive is applied to the upper surface of the device substrate. A reinforcing substrate (e.g., glass) is placed on the layer of uncured adhesive, and the adhesive is cured. After curing the resin adhesive has a hardness of no greater than 40 (as measured by the JIS-A standard). With such an adhesive, when the resin adhesive cures, no stress is applied to the device substrate even a difference exists in the thermal expansion coefficients of the cured adhesive and the device substrate.

26 Claims, 5 Drawing Sheets

SEMICONDUCTOR DEVICES INCLUDING BACK-SURFACE-INCIDENCE CCD LIGHT-SENSORS, AND METHODS FOR MANUFACTURING SAME

FIELD OF THE INVENTION

This invention pertains to semiconductor devices and their manufacturing methods, in particular to rear surface incident-type light receptacle devices, which are useful for detection of ultraviolet and other short wavelength energy beams, and their manufacturing methods.

BACKGROUND OF THE INVENTION

In image-pickup devices based on charge-coupled device (CCD) architecture, incident photons are received by an array of pixel units (CMOS capacitors) on a silicon substrate. Each pixel comprises an electrode (sometimes called a "gate") mounted on the silicon substrate with an intervening thin dielectric layer. In the silicon beneath each electrode, a depletion region ("charge well") is formed. As a photon having an energy greater than the energy gap of the respective MOS capacitor enters the depletion region of a pixel, if the photon is absorbed in the depletion region, then the photon produces an electron-hole pair. The electron stays within the charge well to contribute to a charge accumulated there over a defined time interval. After the time interval (i.e., periodically), the respective charge wells of the pixels are "read out" in a controlled manner to downstream processing electronics that convert the charge data into corresponding image data. Several conventional schemes have been devised for outputting the charges from the pixels. One scheme is termed the "full-frame transfer" (FFT) scheme. With FFT, the optics used to direct incident light to the light-detecting surface can be at maximal aperture.

In certain types of conventional FFT-type CCD arrays, a representative pixel includes an electrode ("gate") situated over the respective depletion region (charge well) of the pixel. For a CCD array sensitive to visible light, the electrode usually is made of ITO (indium tin oxide) or other suitable material that is transparent to certain wavelengths of incident light. Specifically, "long-wavelength" light (e.g., visible light), to which the electrode has a relatively low absorption coefficient, passes from an upstream direction through the electrode to the respective charge well. In each pixel, the electrode is situated proximally to the respective charge well (but separated from the charge well by the thin dielectric layer). The charge well accumulates charge from photons of the long-wavelength light transmitted through the electrode. The electrode has large respective absorption coefficients for light wavelengths that are relatively short (e.g., ultraviolet light) as well as for certain particulate radiation such as electrons. This absorption significantly reduces the sensitivity of the CCD array.

So-called "back-side-incidence" (BSI) CCD arrays have been proposed for detecting short-wavelength light and certain types of particulate radiation. In these arrays, with respect to each pixel, the light-incidence surface is on a "back" or "rear" surface of the silicon substrate, opposite a "front" surface on which the dielectric layer and the electrodes (gates) of the pixel are formed.

In BSI CCD arrays, as noted above, the substrate is usually silicon. The substrate typically is "thin" compared to the thickness of the silicon substrate of a conventional front-side-incidence CCD array (typically 300 $\mu$m to 500 $\mu$m). The "thin" substrate in a BSI CCD array has a thickness of approximately 10 $\mu$m to 20 $\mu$m. The substrate is thin in a BSI CCD because short-wavelength light has a relatively large absorption coefficient in silicon. Short-wavelength photons are absorbed near the incidence surface and converted to electron-hole pairs in the substrate proximal to the light-incidence surface. If the substrate were thicker, then the electron-hole pairs would recombine within the substrate before electrons could reach the respective depletion regions. This recombination substantially reduces the sensitivity of the device. Also, a thicker substrate in a BSI CCD array would tend to "mix" the electrons produced in various pixels, which would reduce the image resolution of the device.

The thin CCD substrate used in a BSI CCD array has low mechanical strength. To increase the strength, a "reinforcing substrate" (made of, e.g., silicon or glass) conventionally is bonded to the "front" surface of the CCD substrate (i.e., the surface on which the electrodes are formed). Such reinforcement prevents damage to the CCD substrate during various subsequent processing steps executed on the surface of the CCD substrate of the BSI CCD array, and facilitates handling during later fabrication processes (such as dicing).

According to conventional bonding methods, the reinforcing substrate is bonded to the CCD substrate using an adhesive having a post-cure hardness exceeding a certain hardness threshold. The adhesion is created by first applying a liquid silicate or other silicon oxide material to the reinforcing substrate, such as conventionally used when applying a layer of borophosphosilicate glass (BPSG) or spun-on glass (SOG). Then, an epoxy or other general-purpose resin adhesive is applied to adhere the CCD substrate to the silicon oxide surface of the reinforcing substrate.

Operationally, BSI CCD arrays must transfer photons efficiently from the light-incidence surface (back surface) of the CCD substrate to the respective depletion regions (charge wells) located on the front surface of the CCD substrate. To facilitate efficient diffusion of photons, ideally no crystal defects or metallic impurities should be present in the CCD substrate.

Conventional methods for fabricating BSI CCD arrays are directed to preventing formation of crystal defects and maintaining unwanted metallic impurities to insignificant concentrations in the CCD substrate. First, a semiconductor (silicon) "fabrication" substrate is prepared as a wafer on which the CCD substrate is formed subsequently by epitaxial growth. The fabrication substrate is formed with intrinsic gettering (IG) to minimize formation of crystal defects at least in a surficial layer of the fabrication substrate. The surficial layer is termed the "low-defect layer," and its surface is termed the "low-defect surface." The epitaxy is performed on the low-defect surface to form the CCD substrate. After forming the epitaxial layer, other layers and the pixel electrodes are formed on the epitaxial layer, followed by bonding of the reinforcing substrate. During a downstream step, the fabrication substrate is removed, such as by wet-etching, as discussed below.

Using the conventional process described above, it is difficult to obtain a BSI CCD array having a desired high sensitivity and resolution for short-wavelength light. There are several reasons for this difficulty.

First, as noted above, silicon oxide and a resin adhesive normally are used to bond the CCD substrate to the reinforcing substrate. Although silicon oxide adheres well to the reinforcing substrate, this bond is vulnerable to failure, resulting in the CCD substrate peeling away from the reinforcing substrate, especially during later fabrication steps (e.g., dicing). In addition, the surfaces to be bonded together must be mutually level during bonding. Consequently, the bonding process is complex inasmuch as it involves applying a silicon-based material (silicon oxide) onto a silicon-based reinforcing substrate, polishing the silicon-based material, applying the adhesive, and high-temperature processing to cure the adhesive.

Second, when using a general-purpose resin adhesive for bonding, stress arises in the adhesive interface after the adhesive is cured. The stress arises from differences in thermal-expansion coefficients of the substrates being bonded versus the adhesive itself. The stress is manifest as bending strain of the CCD substrate, causing operational problems such as disruptions in the transmission of photons through the CCD substrate to the respective diffusion layers and in the conduction of electrons from the diffusion layers to the respective electrodes. The stress also causes physical damage to the pixels.

Third, after forming the epitaxial layer on the low-defect surface of the fabrication substrate, the fabrication substrate is removed, usually by wet-etching. Wet-etching proceeds through the fabrication substrate to the low-defect layer. As etching progresses through the thickness of the fabrication substrate to the low-defect layer, crystal-defect locations tend to be etched more readily and more rapidly. Hence, when etching approaches near the low-defect layer, crystal-defect scars form in the low-defect layer. With further etching, these crystal-defect scars propagate to the low-defect surface and hence to the epitaxial CCD-substrate layer, ultimately creating crystal-defect scars on the front surface of the epitaxial CCD-substrate. Crystal-defect scars on the front surface of the CCD substrate scatter incident light and also serve as recombination sites for electron-hole pairs, causing reduced resolution and sensitivity.

To reduce propagation of crystal-defect scars as described above, mechanical polishing conceivably could be used instead of or in combination with wet-etching. With mechanical polishing, the crystal-defect areas and non-defective areas more likely would be polished at equal rates. Thus, polishing could produce a level polished surface with no crystal-defect scars. However, interaction of abrasive particles with the abraded surface during polishing and the presence of residual abrasive particles on the surface after polishing produce a type of crystal defect termed a "fabrication-distortion layer" on the non-defect surface and thus on the surface of the epitaxial CCD-substrate layer. The fabrication-distortion layer causes scattering of photons, in a manner similar to scattering caused by crystal-defect scars. The fabrication-distortion layer also creates recombination sites for electron-hole pairs, thereby reducing resolution and sensitivity.

Fourth, anomalies occur during wet-etching. Whereas a liquid etchant could be applied as a thin film to the surface of the fabrication substrate being etched, etching normally is simplified (and accelerated) by immersing the entire fabrication substrate in the etchant. But, total immersion also would etch the reinforcing substrate, thereby weakening the entire structure. Furthermore, if etching of the reinforcing substrate is non-uniform, then a non-uniform surface is presented for attachment to the device package at the time the BSI CCD device is placed in a suitable package. This uneven-surface mounting also causes the light-incidence surface to be misaligned relative to incoming light to be detected, causing reduction in resolution and sensitivity of the CCD.

SUMMARY OF THE INVENTION

In view of the shortcomings of conventional methods and devices as summarized above, an object of this invention is to provide improved fabrication processes for manufacturing semiconductor devices, wherein during fabrication less stress is applied to a substrate upon which one or more elements of the semiconductor device are formed. Another object is to provide improved fabrication processes for manufacturing back-surface-incidence (BSI) CCD light sensors, wherein during fabrication less stress is applied to a relatively thin device substrate ("CCD substrate") upon which one or more light-sensing elements of the BSI CCD light sensor are formed. These processes include attaching a reinforcing substrate using an adhesive.

Yet another object is to provide semiconductor-device fabrication methods that substantially reduce, compared to conventional methods, incidence of crystal defects in the CCD substrate.

Yet another object is to provide semiconductor-device fabrication methods including steps of epitaxial growth of a device substrate on a low-defect surface of a fabrication substrate, bonding a reinforcing substrate to the device substrate, and protecting the reinforcing substrate so that it is not etched during a wet-etching step performed to remove the fabrication substrate.

To any of such ends, and according to a first aspect of the invention, processes are provided for fabricating a semiconductor device including a reinforcing substrate. In an embodiment of such a method, a semiconductor-device element is formed on an upper surface of a semiconductor substrate. An uncured resin adhesive is provided that is capable of bonding the semiconductor substrate to a reinforcing substrate. The resin adhesive is formulated to cure to a hardness of no greater than 40 as measured using the JIS-A hardness standard. A layer of the uncured resin adhesive is applied to the upper surface of the semiconductor substrate. The reinforcing substrate is applied to the layer of uncured resin adhesive, and the resin adhesive is cured. The reinforcing substrate can be, for example, silicon or glass. This embodiment reduces stress on the device substrate that otherwise would arise after curing of the resin adhesive. Stress is alleviated even if there is a significant difference in the thermal-expansion coefficients of the cured resin adhesive and the device substrate. As a result, bending and damage to the device substrate do not occur.

The uncured resin adhesive desirably has a pre-cure viscosity of no greater than 9 Ns/mL. This allows the uncured adhesive to be applied by spin coating, wherein the semiconductor substrate is rotated while the uncured resin adhesive is applied onto the upper surface of the semiconductor substrate. Spin-coating in this manner results in a uniform application of the adhesive.

Another embodiment of a method according to the invention is directed to a process for fabricating a back-surface-incidence (BSI) CCD light sensor. In this method, a semiconductor substrate is provided having a thickness of 10 $\mu$m to 20 $\mu$m. A light-receiving element is formed on the front surface of the semiconductor substrate, wherein the rear surface is destined to be a light-incidence surface of the light sensor. A layer of an uncured resin adhesive as summarized above is applied to the rear surface of the semiconductor substrate, over the light-receiving element. The reinforcing substrate is applied to the layer of uncured resin adhesive, followed by curing of the resin adhesive. Upon executing a process according to this embodiment, a BSI CCD light sensor is produced that exhibits no excessive stress imposed by the cured resin adhesive on the device substrate. Consequently, there is no bending or substrate damage at locations where the light-receiving element(s) are formed, resulting in consistent properties from one element to the next.

In yet another embodiment of a fabrication process according to the invention, a semiconductor fabrication substrate is produced with intrinsic gettering. A low-defect layer is formed on the front surface and rear surface of the fabrication substrate, with an intervening high-defect layer situated between the low-defect layers. An epitaxial layer is formed on the front-surface low-defect layer. A semiconductor-device element is formed on the front surface of the epitaxial layer. A layer of an uncured resin adhesive (such as summarized above) is applied to the front surface of the epitaxial layer and to the semiconductor-device element. A reinforcing substrate is applied to the layer of uncured adhesive, the adhesive is cured to bond the reinforcing substrate to the epitaxial layer. The rear-surface low-defect layer and the high-defect layer are removed by mechanical abrasion, and the front-surface low-defect layer is removed by wet-etching. In this process, the step of forming the semiconductor-device element can include forming a light-receiving element on the epitaxial layer, wherein the rear surface of the epitaxial layer is destined to be a light-incidence surface for the light-receiving element. Using this process, no crystal-defect scars form or remain on the epitaxial layer or on the front-surface low-defect layer. This results in a high-quality device substrate in which crystal defects are reduced substantially.

In yet another embodiment of a fabrication process according to the invention, a semiconductor fabrication substrate is produced with intrinsic gettering, as summarized above. A low-defect layer is formed on the front surface and rear surface of the fabrication substrate, with an intervening high-defect layer situated between the low-defect layers. An epitaxial layer is formed on the front surface of the fabrication substrate. A semiconductor-device element is formed on the front surface of the epitaxial layer. A layer of an uncured resin adhesive is applied to the front surface of the epitaxial layer and to the semiconductor-device element. A reinforcing substrate is placed on the layer of uncured adhesive, wherein the rear surface of the reinforcing substrate contacts the adhesive. The resin adhesive is cured, and a protective substrate is attached to the front surface of the reinforcing substrate, using a removable adhesive. The rear-surface low-defect layer, the high-defect layer, and at least a portion of the front-surface low-defect layer are removed by wet-etching, followed by removal of the protective substrate. During wet-etching, the protective substrate protects the reinforcing substrate from unintended etching, preventing the epitaxial layer from being misaligned when the device (with reinforcing substrate) is mounted in a suitable package. In this process, the step of forming a semiconductor-device element on the front surface of the epitaxial layer can include forming a light-receiving element on the epitaxial layer, wherein the rear surface of the epitaxial layer is destined to be a light-incidence surface for the light-receiving element. Hence, the process can be used to fabricate a BSI CCD light sensor.

In the method summarized above, the epitaxial layer desirably has a defect density of no greater than $1 \times 10^3/cm^3$, as measured using the Secco etching method. An exemplary removable adhesive is hot wax, which can be washed off easily using fuming sulfuric acid, for example.

According to another aspect of the invention, any of various semiconductor devices are provided, as fabricated using any process within the scope of the invention. Such devices encompass BSI CCD light sensors.

The foregoing and additional features and advantages of the invention will be more readily apparent from the following detailed description, which proceeds with reference to the accompanying drawings.

DETAILED DESCRIPTION

Figure 1:
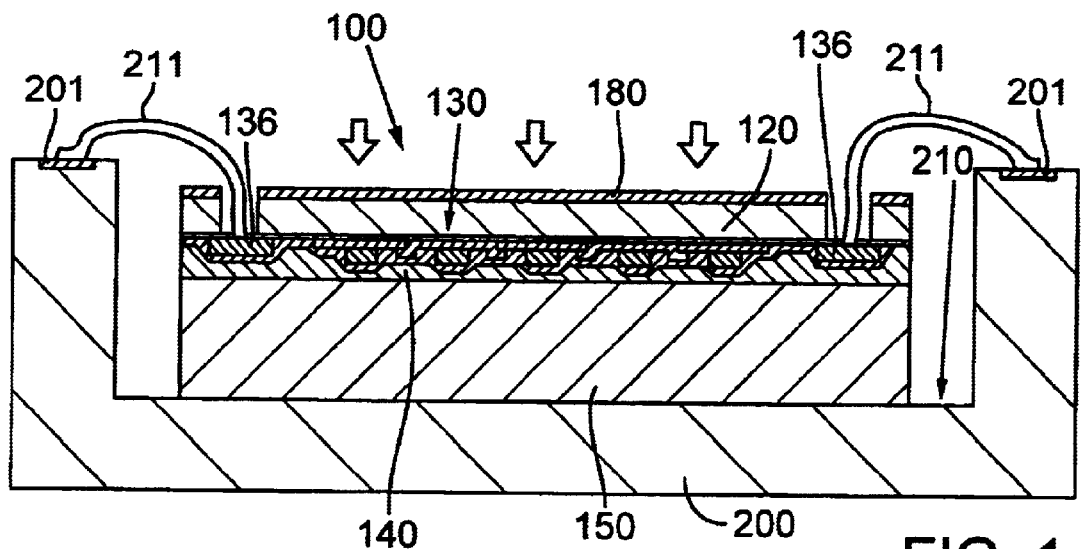
FIG. 1 is an elevational section of a back-surface incidence (BSI) light sensor 100 according to a representative embodiment of this invention.

Various aspects of the invention are described below in the context of representative embodiments that are not intended to be limiting in any way. Also, the following description relies, for convenience in referring to the figures, upon terms such as "above" and "below" to refer to positional relationships. It will be understood that these terms refer to configurations as depicted in the drawings and are not intended to imply absolute positional relationships within an actual device. This is because actual devices can have any of various orientations in three-dimensional space, wherein positional relationships of "above," "below," and the like do not necessarily apply.

A representative embodiment of a back-surface-incidence (BSI) light sensor 100 is described with reference to FIGS. 1 and 2(A)–2(B). Turning first to FIG. 1, the device 100 comprises a "device substrate" (also termed a "CCD substrate") 120; a "light-receiving array" 130 of multiple light-receiving units ("pixels) situated on the back side of the CCD substrate 120; a resin adhesive 140 applied to the underside of the CCD substrate 120 and light-receiving array 130; a reinforcing substrate (desirably made of glass) 150 bonded by the resin adhesive 140 to the light-receiving array 130; and an anti-reflective film 180 situated on the top surface of the CCD substrate 120. The underside of the reinforcing substrate 150 is attached to a container unit 210 (desirably made of ceramic) of a device package 200. Metal wiring traces 136 extend along the upper surface of the CCD substrate 120 and are connected electrically via wires 211 to respective electrodes 201 situated on the device package 200.

The CCD substrate 120 in this embodiment desirably is p-type epitaxial silicon. As shown in FIG. 2(A), depicting a single pixel of the light-receiving array 130, the CCD substrate 120 includes an n-type diffusion layer 120B formed by ion implantation into the underside of the CCD substrate 120. Below the diffusion layer 120B are the various layers constituting elements of a pixel of the light-receiving array 130. These layers include a silicon oxide film 131 beneath the diffusion layer 120B, first and second transfer electrodes 132, 133, respectively, and a passivation layer 134. Finally, the reinforcing substrate 150 is bonded to the underside of the passivation layer 134 by the resin adhesive 140.

Figure 2A:
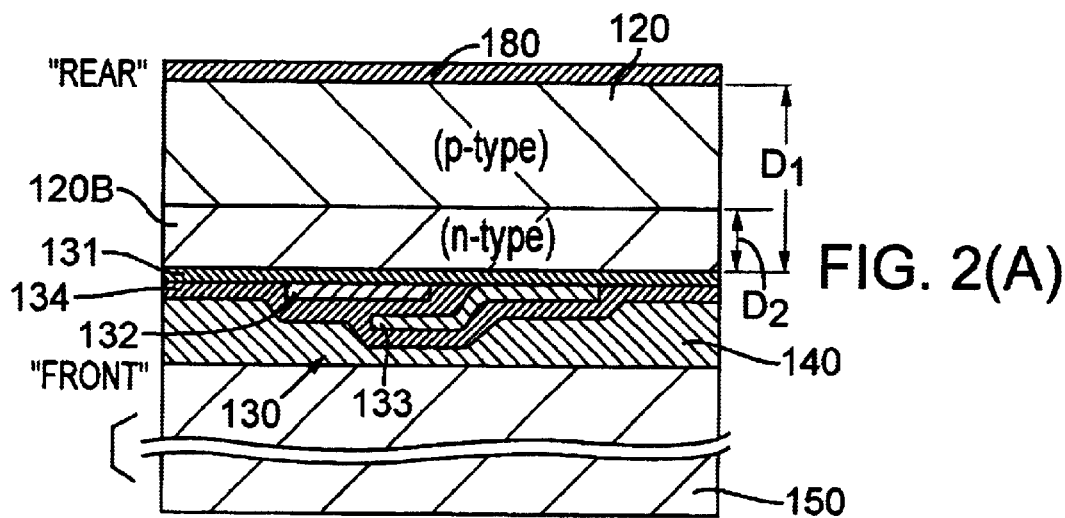
FIG. 2(A) is an enlarged vertical section of a pixel of the light-receiving array 130 of the embodiment of FIG. 1.
Figure 2B:
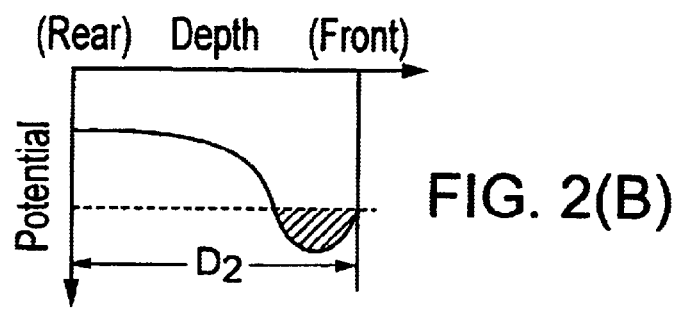
FIG. 2(B) is a plot showing a drop in electrical potential from the rear surface to the front surface of the device substrate ("CCD substrate") in the embodiment of FIG. 1.

In the BSI light sensor 100 as shown in FIGS. 1 and 2(A), electrical potential drops in the CCD substrate from the rear surface (top in FIGS. 1 and 2(A)) to the front surface (bottom in FIGS. 1 and 2(A)), as shown in FIG. 2(B)). Since the rear surface of the device 100 functions as a light-incidence surface (note large open arrows in FIG. 1 denoting incident light), the thickness $D_1$ of the CCD substrate 120 desirably is in the range of 10 μm to 20 μm. With such a configuration, electrons generated by light received on the light-incidence surface are transferred efficiently to the light-receiving array 130 situated on the front surface of the device.

During operation of the light sensor 100, incident light impinges from above in FIG. 1 on the "rear," or "back," surface of the device. Electrons generated in the CCD substrate 120 propagate downward in the figure to the charge wells in the n-type diffusion layer 120B.

The defect density of the CCD substrate 120 desirably is no greater than $1 \times 10^3/cm^3$, using the Secco etch measurement method. A Secco etch is performed using a liquid etchant containing one part 0.15 mol/L aqueous $K_2Cr_2O_7$ solution and two parts 50% (w/w) aqueous HF. This solution exhibits rapid etching of silicon in defect regions. After etching, the sample is examined by microscopy, which reveals the crystal defects. The crystal-defect density is determined readily from the microscope images. The thickness $D_2$ of the n-type diffusion layer 120B desirably is approximately 1 μtm to 2 μm.

The resin adhesive 140 desirably has a post-curing hardness of no greater than 40 (as measured using the JIS-A standard). It has been found that such an adhesive prevents bending or cracking of the CCD substrate 120 even when a difference exists in the thermal-expansion coefficients of the CCD substrate 120 and the cured adhesive 140 sufficient to cause stress between these two layers. I.e., if such a stress should arise, then the adhesive 140 would absorb and thus ameliorate the stress.

Candidate resin adhesives include thermal-curing resins (e.g., epoxy resins such as any of various resins manufactured by Epoxy Technology, Inc., Billerica, Mass., USA), thermoplastic resins (e.g., rubber or any of various compositions manufactured by Alpha Metals, Inc., Jersey City, N.J., USA), and silicone adhesives (e.g., DA6501 or JCR6132N manufactured by Toray Dow Corning Silicone Co., Ltd, Japan).

In an embodiment of a method for manufacturing the BSI light sensor 100, the results of certain steps are shown in FIGS. 3(A)–3(H). The method includes forming the CCD substrate 120, bonding the reinforcing substrate 150 to the CCD substrate 120, and bonding a protective silicon substrate (protective substrate) 70. Other aspects of the method are well known and are not discussed, including details of the individual pixels in the light-receiving array 130, processing circuits for processing signals from the pixels, the diffusion region 120B, and the inter-layer insulating layers.

To start, a silicon "fabrication substrate" 10 is prepared with intrinsic gettering (IG) using a p-type impurity such as boron. The impurity is added to the silicon at the time of making the silicon ingot. The resulting concentration of p-type impurity is relatively high at approximately $1 \times 10^{20}$ $cm^{-3}$. A "low-defect layer" ("denuded zone" or "DZ layer") 11 is formed on each of the front and rear surfaces of the fabrication substrate 10. The low-defect layer is formed by intrinsic gettering (IG). An example IG regimen is 950° C. for 30 minutes in an $O_2$ atmosphere; 1100° C. for 30–60 minutes in a $N_2$ atmosphere; increase temperature at a constant rate of 5° C./min to 1000° C.; then hold at 1000° C. for 600–1200 min in an $N_2$ atmosphere. The final heat-annealing step can be omitted if desired.

Figure 3A:
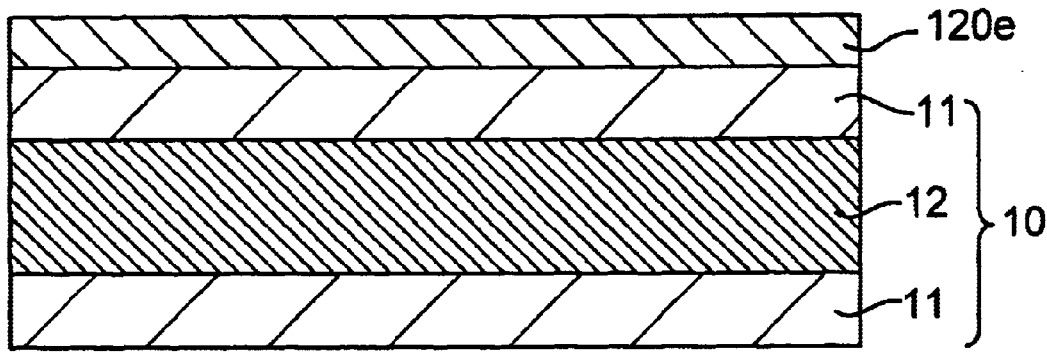
FIGS. 3(A)–3(H) show the results of respective steps in a representative embodiment of a method, according to the invention, for manufacturing a BSI light sensor such as that shown in FIG. 1. The detail in each figure is shown in schematic vertical section.

Each of the low-defect layers 11 desirably has a thickness of 10 μm to 80 μm, more desirably 20 μm to 30 μm, as discussed later below. In the middle-thickness region of the fabrication substrate 10 is a high-defect layer 12. An epitaxial growth apparatus is used to form a layer 120e of epitaxial silicon on the upper surface of one of the low-defect layers 11. The thickness of the epitaxial layer 120e desirably is approximately 10 μm to 20 μm, and p-type impurities are introduced into the epitaxial layer 120e at a relatively low concentration (approximately $1 \times 10^{14}$ $cm^{-3}$) during formation of the epitaxial layer 120e. The epitaxial layer 120e is destined to become the CCD substrate 120. FIG. 3(A) shows the results of this step.

Figure 3B:
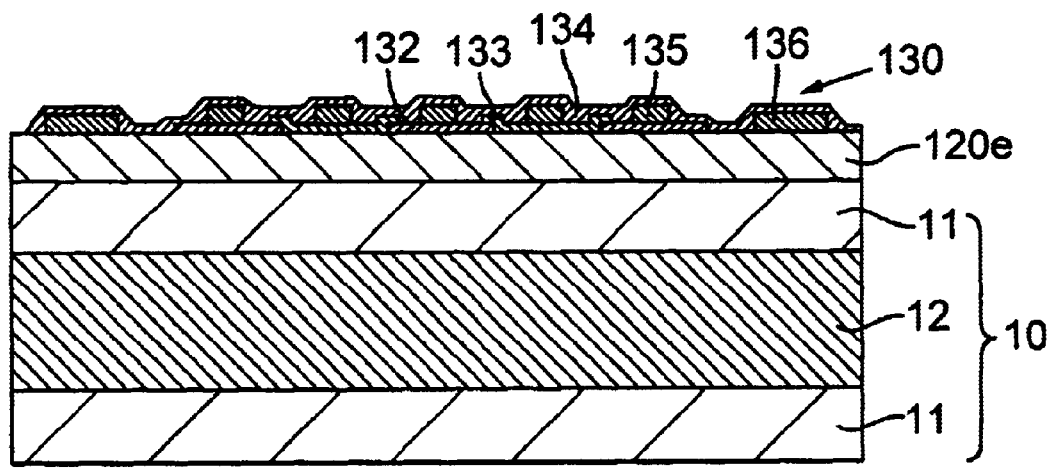

Next, polysilicon first transfer electrodes 132 are formed on the epitaxial layer 120e. In the finished device, the first transfer electrodes 132 facilitate transfer of charges from the respective pixels. Also formed are polysilicon second transfer electrodes 133 that function in cooperation with the first transfer electrodes 132. Metal wiring traces 135, 136 are formed on the epitaxial layer 120e. The wiring traces 135, 136 output signals externally from the first and second transfer electrodes 132, 133. The transfer electrodes 132, 133 and wiring traces 135, 136 on the epitaxial layer 120e comprise the pixel array 130. A passivation layer 134 made, e.g., of PSG (phosphosilicate glass) or BPSG (borophosphosilicate glass) is applied to form an insulating silicon oxide film on the front surface of the epitaxial layer 120e. FIG. 3(B) shows the results of this step.

Figure 3C:
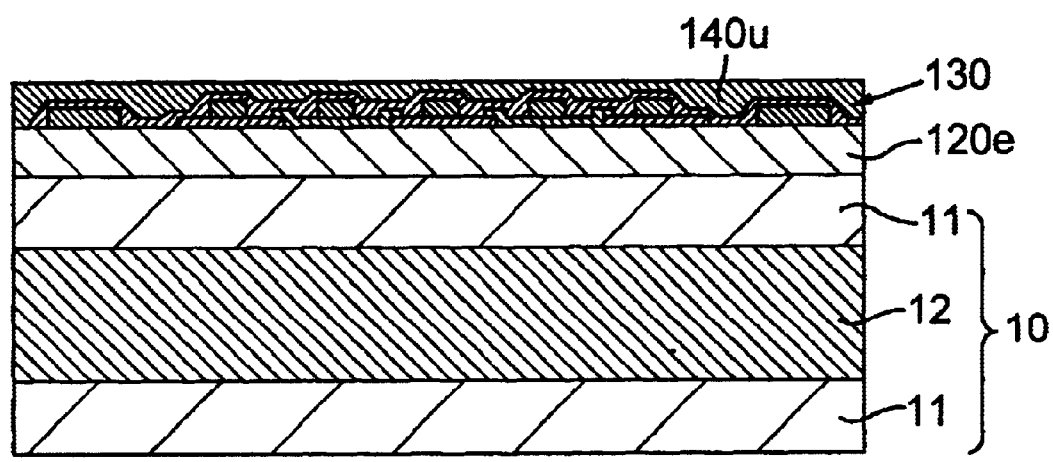

Next, a spin coater is employed to apply a liquid resin adhesive 140u (e.g., a silicone-based adhesive) so as to cover all the epitaxial layer 120e and other elements of the light-receiving array 130. To apply the liquid adhesive 140u using the spin coater, the liquid is dripped onto the upper surface of the epitaxial layer 120e as the fabrication substrate 10 with epitaxial layer 120e are rotated at a controlled rotational velocity. By controlling the rotational velocity and duration of rotation, the thickness of the applied resin adhesive 140u on the surface can be controlled. Uncured resin adhesive 140u has a pre-cure viscosity of no greater than 9 N•s/m², allowing the adhesive to be applied evenly using the spin coater. Also, the resin adhesive 140u, when later cured into the adhesive 140, is formulated to have a post-cure hardness of no greater than 40 (JIS-A standard), as stated previously. FIG. 3(C) shows the results of this step.

Figure 3D:
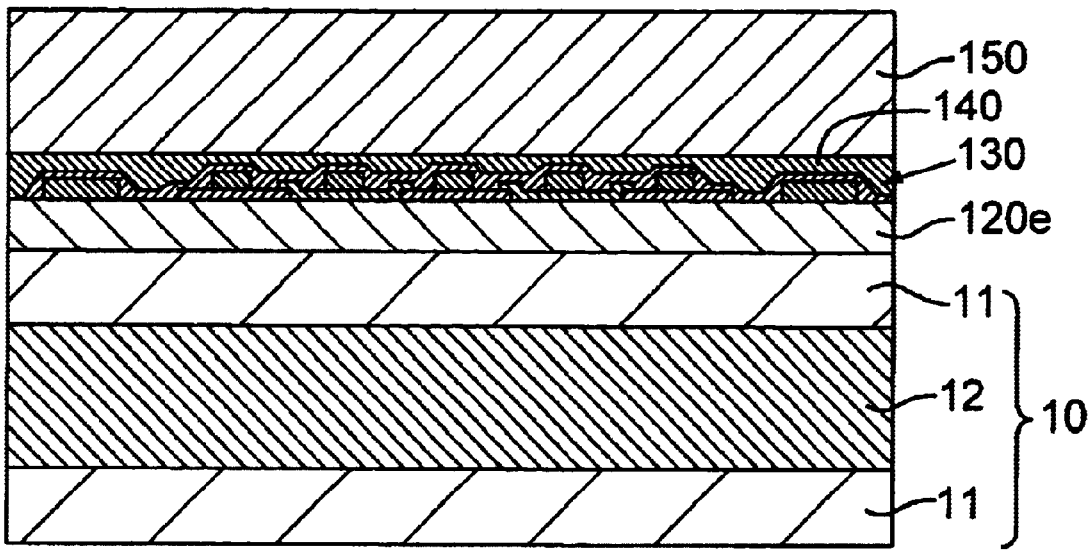

The reinforcing substrate 150 (desirably made of glass) is mounted from above onto the epitaxial layer 120e, upon which the uncured resin adhesive 140u has been applied evenly. The glass used to make the reinforcing substrate 150 desirably has the same thermal expansion coefficient as the epitaxial layer 120e. Hence, the epitaxial layer 120e to which the reinforcing substrate 150 is bonded does not bend or deform during a downstream heating step to cure the resin adhesive 140u. The resin adhesive 140u is cured thermally to form the cured adhesive 140 that bonds the epitaxial layer 120e to the reinforcing substrate 150. FIG. 3(D) shows the results of this step.

Figure 3E:
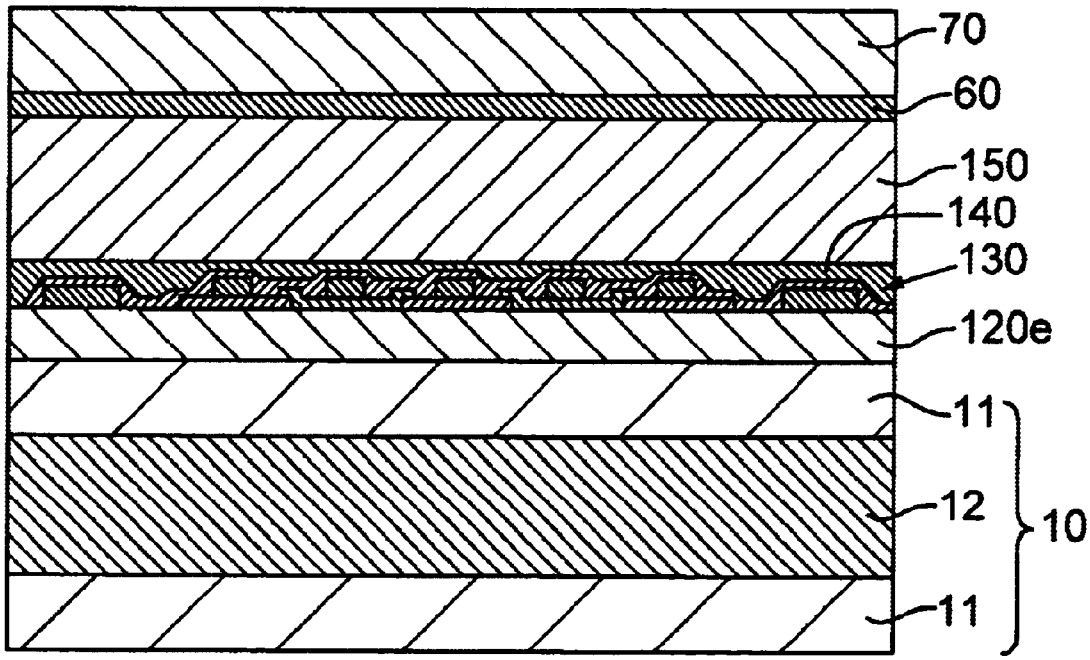

Next, an easily stripped adhesive (e.g., hot wax 60) is applied to the reinforcing substrate 150. The fabrication substrate 10, epitaxial layer 120e, and reinforcing substrate 150 are each heated to the melting point of the hot wax 60, causing the hot wax 60 to melt. A silicon "protective" substrate 70 is applied to the upper surface of the melted wax 60. As the wax 60 cools, it bonds the protective substrate 70 to the upper surface of the reinforcing substrate 150. FIG. 3(E) shows the results of this step.

Figure 3F:
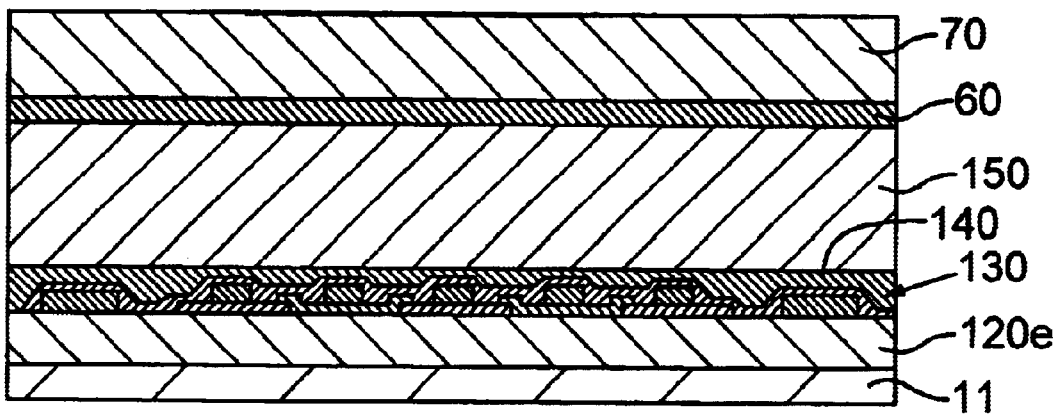

Next, a polishing apparatus is used to lap (mechanically polish) the fabrication substrate 10. During this polishing step, at least the distal low-defect layer 11 and the high-defect layer 12 of the fabrication substrate 10 are removed completely. Polishing is continued so as to smooth the front surface (under-surface as illustrated) of the remaining low-defect layer 11. FIG. 3(F) shows the results of this step.

Figure 3G:
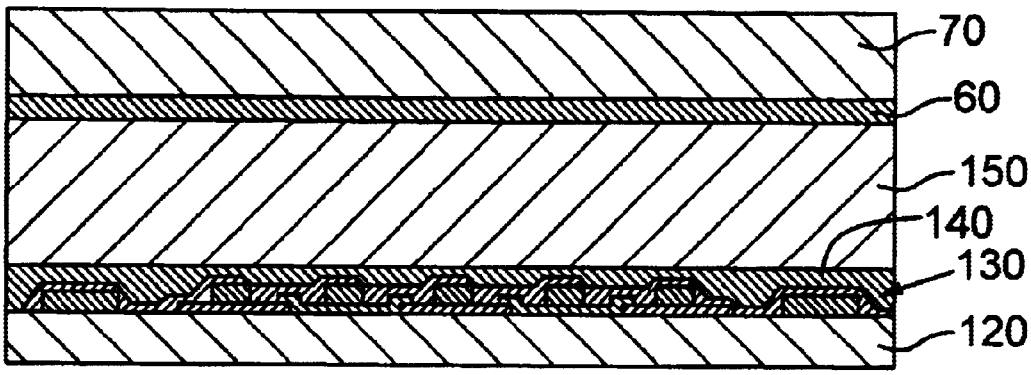

Chemical etching (anisotropic wet-etching) is performed on the front surface of the remaining low-defect layer 11 on the fabrication substrate 10. Thus, the remaining low-defect layer 11 is removed. By performing the wet-etching step after the mechanical polishing step, even if a layer of crystal defects termed "fabrication distortions" are produced on the front surface of the low-defect layer 11 by polishing and by the presence of residual particles of abrasive, the layer of fabrication-distortions nevertheless is removed by the wet-etching step. Wet-etching is performed using a liquid etchant that desirably is a 1:3:8 mixture of hydrogen fluoride, nitric acid, and acetic acid. This etchant completely removes any fabrication-distortions produced by mechanical polishing, and produces a CCD substrate 120 having the desired thickness (10 $\mu$m to 20 $\mu$m). FIG. 3(G) shows the results of this step.

The mechanical polishing (lapping) is performed on the fabrication substrate 10 to remove the high-defect layer 12 completely before initiating the wet-etching step. If wet-etching were to be performed with any of the high-defect layer 12 remaining, then the etching would proceed rapidly through the high-defect layer 12 wherever crystal defects were present, and would produce crystal-defect scars on the front surface of the remaining low-defect layer 11 as etching reaches the low-defect layer 11. This would result in a non-uniform surface and transcription of the crystal-defect scars from the remaining low-defect layer 11 onto the CCD substrate 120. In other words, by performing mechanical polishing before wet-etching, the high-defect layer 12 is removed mechanically, and no crystal-defect scars are produced on the low-defect layer 11 or the CCD substrate 120 even after performing a subsequent wet-etching step on the remaining low-defect layer 11.

Also, by performing wet-etching after mechanical polishing, it is possible to remove any fabrication distortions arising from the mechanical polishing. Hence, scattering of incident light from a fabrication-distortion layer is eliminated. Also eliminated are electron-hole recombination sites. As a result, resolution and sensitivity of the device 100 are improved relative to conventional devices.

Figure 3H:
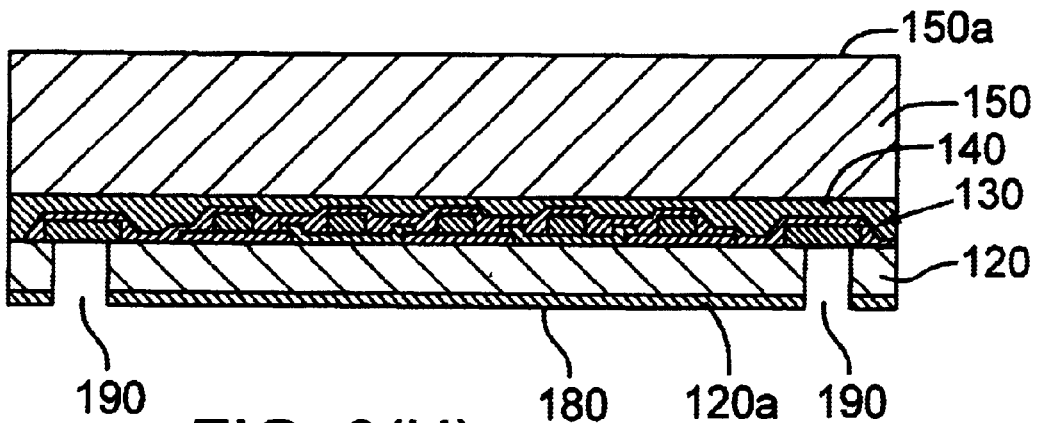

After performing wet-etching on the CCD substrate 120 in a manner as described above, the entire mass is heated to melt the hot wax 60 and allow the protective substrate 70 to be stripped away. The residual hot wax 60 is washed away using fuming nitric acid (e.g., "RA Stripper" manufactured by Kanto Kogaku, Japan, and containing a nitric concentration of 86% or more). Then, the anti-reflection film 180 is formed on the front surface of the CCD substrate 120. Also formed are contact holes 190 that serve to expose the metal wiring traces 136. Since the reinforcing substrate 150 is not subjected to wet-etching, no thinning of the reinforcing substrate occurs, and the upper surface of the reinforcing substrate remains uniform. FIG. 3(H) shows the results of this step.

Then, the CCD substrate 120, upon which the BSI light sensor 100 is formed, is diced or otherwise divided into individual devices. Afterward, die-bonding and wire-bonding processes are executed. The devices are placed into individual packages 200, yielding the BSI light sensor 100 shown in FIG. 1(A). In the device 100, the exposed surface 150a (top surface in the drawing) of the reinforcing substrate 150 is attached to a container unit 210, so the rear surface 120a of the CCD substrate 120 is not misaligned with the plane of the package 200.

Experiments were conducted to confirm the conditions under which the manufacturing method described above yields the fewest crystal defects in the CCD substrate 120 in a BSI light sensor 100. Multiple fabrication substrates 10 were prepared with IG using boron, as described above. Low-defect layers 11 were formed on each surface of each of the fabrication substrates 10. With respect to the various fabrication substrates, each low-defect layer 11 had a different respective thickness in the range of 10 $\mu$m to 80 $\mu$m. A layer of epitaxial silicon 120e was grown to a thickness of 10 $\mu$m to 20 $\mu$m on one low-defect layer 11 of each fabrication substrate 10 to form respective CCD substrates 120. On each CCD substrate 120 were formed respective light-receiving arrays 130 to complete formation of the BSI light sensors 100.

With each light sensor thus made, performance properties (e.g., sensitivity, resolution, incidence of defective pixels, etc.) were evaluated. The evaluations revealed that optimal properties were obtained whenever the low-defect layer 11 was formed at a thickness of 20 $\mu$m to 30 $\mu$m.

The Secco etching method was used to measure the defect density in the low-defect layers 11. The target defect density was no greater than $1 \times 10^3/cm^3$, both in the low-defect layers 11 and in the epitaxial layer 120e.

The experimental results indicated that, in order to produce a defect density of no greater than $1 \times 10^3/cm^3$, the low-defect layer 11 desirably has a thickness of 20 $\mu$m to 30 $\mu$m. If the thickness of the low-defect layer 11 were less than 20 $\mu$m, then the effective denuded zone would be too shallow, resulting in excessive numbers of crystal defects on the front surface of the fabrication substrate 10. If the thickness were greater than 30 $\mu$m, then metallic impurities on the surface of the fabrication substrate 10 would not be drawn completely away into the crystal-defect layer 12.

Accordingly, if the fabrication substrate 10 is prepared such that the low-defect layer 11, on which the epitaxial substrate 120e is formed, has a thickness in the range of 20 $\mu$m to 30 $\mu$m, then the defect density of the CCD substrate 120 is no greater than $1 \times 10^3/cm^3$. When produced on such a substrate, the resulting BSI light sensors exhibit optimal performance.

Figure 4A:
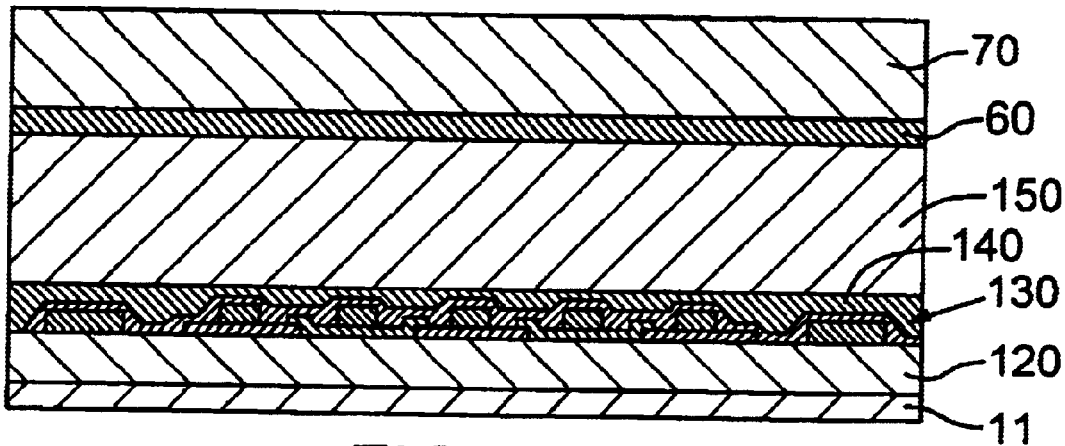
FIGS. 4(A)–4(B) show the results of certain steps, corresponding to the respective steps shown in FIGS. 3(G) and 3(H), of a modification of the method embodiment of FIGS. 3(A)–3(H), in which modification a portion of the low-defect layer 11 is left on the rear surface of the CCD substrate 120. The detail in each figure is shown in schematic vertical section.
Figure 4B:
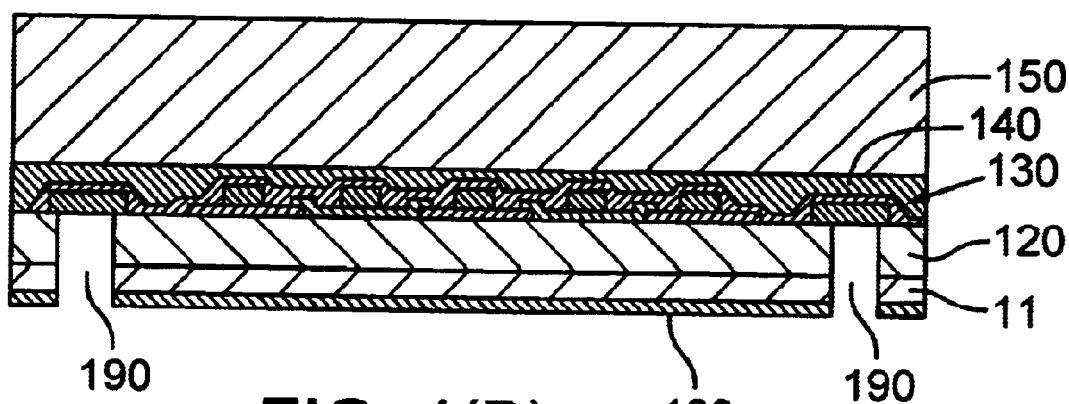

In the process shown in FIGS. 3(A)–3(H), wet-etching was used to remove the low-defect layer 11 completely from the fabrication substrate 10 (FIG. 3(G)). However, even if a portion of the low-defect layer 11 were to remain on the CCD substrate 120 after wet-etching, as shown in FIGS. 4(A)–4(B), the resulting BSI light sensor 100 would exhibit sufficient sensitivity and resolution. Because the crystal-defect layer is removed when the thin-film CCD substrate is formed, it is possible to prevent formation of electron traps (by recombination) in the high-defect layer. Also, the distance through the CCD substrate to the light-receiving array (i.e., CCD-substrate thickness) is short. Hence, it is possible to guide electrons, in an efficient manner, produced by incident light to the light-receiving array. It also is possible to hold cross-talk to low levels because the thickness of the CCD substrate is approximately the same as the pitch of pixels in the pixel array. This configuration yields high sensitivity and high resolution.

In this embodiment, the reinforcing substrate was made of glass. Alternatively, a silicon substrate may be used. (This would require a different adhesive or a change in a property of the adhesive.)

The JIS-A standard as referred to herein is a Japanese Industrial Standard (JIS) used for the hardness testing of rubber materials. This standard can be accessed on the Internet at http://www.mech-da.cojp/mechnews/97-1/news97-1-3-3.html. The method is summarized as follows:

A JIS-A test device comprises a housing that encloses a spring, a gauge, and a mechanism connecting the spring to the gauge. A push-needle protrudes longitudinally from the housing and is connected to the spring. The push-needle is biased in the longitudinal direction by the spring to extend maximally (H=0.254 cm) out of the housing. As the push-needle is depressed axially relative to the housing (such as when the tip of the push-needle is urged against a test material), the push-needle retracts into the housing against the force applied by the spring, which changes the indication on the gauge. The gauge presents a scale indicating hardness. More specifically, as the tip of the push-needle is urged against a compliant test material, the push-needle presses a given distance (depending upon the test material) into the test material by spring force. The more compliant the test material, the lower its hardness, and the greater the penetration of the push-needle into the test material.

The gauge on the test device has a scale of 0 to 100. The gauge reads "0" whenever no force is being exerted from the push-needle to the spring (e.g., whenever the push-needle is being urged against a maximally compliant test material). The gauge reads "100" whenever the push-needle is pushed so as to be retracted maximally in a longitudinal direction (i.e., the full 0.254 cm) into the housing, wherein maximal force is being applied to the spring (e.g., whenever the push-needle is being urged against a rigid test material). The spring has a spring constant k of k=3.15 kg/cm. At a gauge reading of "0", the spring has a pre-compression force of $\Delta P$=0.055 kg. The gauge reading is regarded as an index of hardness.

Hardness testing is derived from elasticity theory. Assuming that the test rubber follows Hooke's law, the press depth $\delta$ of the push needle into the test rubber is represented by Equation (1):

$$\delta = (1-\nu P)/(4aG) \quad (1)$$

wherein $\nu$ is the Poisson ratio, 2a is the diameter of the needle, G is the transverse elasticity coefficient of the rubber, and P is the spring load on the push-needle. Spring properties are expressed by Equation (2), which takes into account the pre-compression force $\Delta P$ of the spring:

$$P = \Delta P + k(H-\delta) \quad (2)$$

wherein k is the spring constant and H is the initial protrusion length of the push spring (H=0.254 cm at a gauge reading of "0"). In Equation (2), if $\nu$=0.5 due to the non-compressibility of the test rubber, then Equation (1) may be represented by Equation (3):

$$\delta = [1/(8aG)][\Delta P + k(H-\delta)] \quad (3)$$

If this relationship is used as a definition of hardness ($H_s$), then it yields equation (4):

$$H_s = (1-\delta/H)100 = 100\{G-[\Delta P/(H8a)]\}/\{G+[k/(8a)]\} \quad (4)$$

With respect to JIS-A hardness-test devices, the following data are provided:

$H = 0.254$ cm, $\Delta P = 0.055$ kg $k = 3.15$ kg/cm $8a = 0.406$ cm, wherein 2a is the needle diameter Hence:

$$(\Delta P/H)8a = 0.53 \text{ kg/cm}^2; k/8a = 7.77 \text{ kg/cm}^2 \quad (5)$$

As is apparent from the above, since the second term on the right in Equation (4) is small, it can be ignored. Further, if $G_{50}$=k/8a, then Equation (4) is simplified as follows.

$$H_s = 100G/(G+G_{50}) \quad (6)$$

Assuming a test rubber with $G=G_{50}$ (constant), then $H_s$=50. Therefore, the constant $G_{50}$ serves as a transverse elasticity coefficient of the rubber, indicating a hardness of 50.

Whereas the invention has been described in connection with preferred embodiments, it will be understood that the invention is not limited to those embodiments. On the contrary, the invention is intended to encompass all modifications, alternatives, and equivalents as may be included in the spirit and scope of the invention, as defined by the appended claims.

What is claimed is:

1. A process for fabricating a semiconductor device including a reinforcing substrate, comprising the steps:
    (a) forming a semiconductor-device element on an upper surface of a silicon substrate;
    (b) providing an uncured resin adhesive capable of bonding the silicon substrate to a reinforcing substrate, the resin adhesive being formulated to cure to a hardness of no greater than 40 as measured using a JIS-A hardness standard;
    (c) applying a layer of the uncured resin adhesive to the upper surface of the silicon substrate;
    (d) applying the reinforcing substrate to the layer of uncured resin adhesive; and
    (e) curing the resin adhesive.

2. The process of claim 1, wherein:
    the uncured resin adhesive has a pre-cure viscosity of no greater than 9 N·s/m²; and
    step (c) comprises rotating the silicon substrate while applying the uncured resin adhesive onto the upper surface of the silicon substrate.

3. The process of claim 1, wherein the reinforcing substrate is selected from the group consisting of silicon and glass.

4. The process of claim 1, further comprising the step of polishing the silicon substrate.

5. The process of claim 4, further comprising the step of etching the silicon substrate until remaining silicon substrate has a thickness of 10 μm to 20 μm.

6. The process of claim 1, wherein:
    step (a) comprises forming a passivation layer on the upper surface of the silicon substrate, over the semiconductor-device element; and
    step (c) comprises applying the layer of uncured resin adhesive to the passivation layer.

7. The process of claim 6, wherein step (a) further comprises:
    forming a low-defect layer on the upper surface of the silicon substrate;
    forming an epitaxial layer on the low-defect layer, the epitaxial layer having a front surface; and forming the semiconductor-device element on the front surface of the epitaxial layer.

8. The process of claim 7, wherein step (a) further comprises forming a low-defect layer on a lower surface of the silicon substrate, and a high-defect layer being situated between the low-defect layer on the upper surface and the low-defect layer situated on the lower surface.

9. The process of claim 8, further comprising the step, after step (e), of removing the low-defect layer on the lower surface and at least a portion of the high-defect layer.

10. The process of claim 8, wherein step (g) comprises removing the low-defect layer on the lower surface and at least a portion of the high-defect layer.

11. The process of claim 1, wherein step (a) comprises:
   forming an epitaxial layer on the upper surface of the silicon substrate; and
   forming the semiconductor-device element on the epitaxial layer.

12. A semiconductor device, produced by a process as recited in claim 11.

13. A semiconductor device, produced by a process as recited in claim 11, the device being a back-surface-incidence CCD light detector.

14. The semiconductor device of claim 13, wherein the epitaxial layer has a defect density of no greater than $1 \times 10^3 / cm^3$, as measured using the Secco etching method.

15. The semiconductor device of claim 12, wherein the epitaxial layer has a defect density of no greater than $1 \times 10^3 / cm^3$, as measured using the Secco etching method.

16. A process for fabricating a back-surface-incidence (BSI) CCD light sensor, comprising the steps:
   (a) providing a silicon substrate having a front surface and a rear surface;
   (b) forming a light-receiving element on the front surface of the silicon substrate, wherein the rear surface is destined to be a light-incidence surface of the light sensor;
   (c) providing an uncured resin adhesive capable of bonding the silicon substrate to a reinforcing substrate, the resin adhesive being formulated to cure to a hardness of no greater than 40 as measured using a JIS-A hardness standard;
   (d) applying a layer of the uncured resin adhesive to the rear surface of the silicon substrate, over the light-receiving element;
   (e) applying the reinforcing substrate to the layer of uncured resin adhesive; and
   (f) curing the resin adhesive; and
   (g) beginning at the rear surface, removing the silicon substrate until remaining silicon substrate, at least in a respective region in which the light-receiving element is formed, has a thickness of 10 μm to 20 μm.

17. The process of claim 16, wherein step (b) comprises:
   forming an epitaxial layer on the upper surface of the silicon substrate; and
   forming the semiconductor-device element on the epitaxial layer.

18. A semiconductor device, produced by a process as recited in claim 17, the device being a back-surface-incidence CCD light detector.

19. The semiconductor device of claim 18, wherein the epitaxial layer has a defect density of no greater than $1 \times 10^3 / cm^3$, as measured using the Secco etching method.

20. A semiconductor device, produced by a process as recited in claim 17.

21. The semiconductor device of claim 20, wherein the epitaxial layer has a defect density of no greater than $1 \times 10^3 / cm^3$, as measured using the Secco etching method.

22. The process of claim 16, wherein step (g) is performed by etching the silicon substrate.

23. The process of claim 16, wherein step (g) is performed by polishing the silicon substrate.

24. The process of claim 23, wherein polishing is followed by wet etching until remaining silicon substrate, at least in the respective region in which the light-receiving element is formed, has a thickness of 10 μm to 20 μm.

25. The process of claim 16, wherein step (b) comprises: forming a low-defect layer on the front surface of the silicon substrate, the low-defect layer having an upper surface; forming an epitaxial layer on the upper surface low-defect layer, the epitaxial layer having a front surface; and forming the semiconductor-device element on the front surface of the epitaxial layer.

26. The process of claim 25, wherein step (b) further comprises forming a low-defect layer on a lower surface of the silicon substrate, and a high-defect layer being situated between the low-defect layer on the upper surface and the low-defect layer situated on the lower surface.

* * * * *

UNITED STATES PATENT AND TRADEMARK OFFICE
CERTIFICATE OF CORRECTION

PATENT NO.     : 6,677,178 B2
DATED          : January 13, 2004
INVENTOR(S)    : Yagi It is certified that error appears in the above-identified patent and that said Letters Patent is hereby corrected as shown below:

Column 4,
Line 43, "9 Ns/mL." should read -- 9 N·s/m$^2$. --.

Column 5,
Line 12, "adhesive, the" should read -- adhesive. The --.

Column 6,
Line 42, ""pixels)" should read -- ("pixels") --.

Column 7,
Line 28, "1 μtm" should read -- 1 μm --.
Line 45, "Coming" should read -- Corning --.

Column 11,
Line 8, "http://www.mech-da.cojp/mechnews/97-1/news97-1-3-3.html" should read -- http://www.mech-da.co.jp/mechnews/97-1/news97-1-3-3.html --.
Line 51, "AP" should read -- ΔP --.

Signed and Sealed this

Seventh Day of September, 2004

JON W. DUDAS
*Director of the United States Patent and Trademark Office*